United States Patent [19]

Murai et al.

[11] Patent Number: 5,020,060
[45] Date of Patent: May 28, 1991

[54] ERROR CODE CORRECTION DEVICE HAVING A GALOIS ARITHMETIC UNIT

[75] Inventors: Katsumi Murai, Kyoto; Makoto Usui, Osaka, both of Japan

[73] Assignee: Matsushita Electric Industrial Co., Ltd., Osaka, Japan

[21] Appl. No.: 313,963

[22] PCT Filed: Jun. 28, 1988

[86] PCT No.: PCT/JP88/00646

§ 371 Date: Feb. 17, 1989

§ 102(e) Date: Feb. 17, 1989

[87] PCT Pub. No.: WO89/00363

PCT Pub. Date: Jan. 12, 1989

[30] Foreign Application Priority Data

Jun. 30, 1987 [JP] Japan ................................ 62-162763
Jul. 15, 1987 [JP] Japan ................................ 62-176167

[51] Int. Cl.$^5$ ............................................. G06F 11/10
[52] U.S. Cl. .................................... 371/37.1; 371/40.1
[58] Field of Search .................... 371/37.1, 40.1, 40.2, 371/40.3, 40.4

[56] References Cited

U.S. PATENT DOCUMENTS

| | | | |
|---|---|---|---|
| 4,162,480 | 7/1979 | Berlekamp | 371/37.1 |
| 4,555,784 | 11/1985 | Wood | 371/37.1 |
| 4,584,686 | 4/1986 | Fritze | 371/37.1 |
| 4,597,083 | 6/1986 | Stenerson | 371/37 |
| 4,675,869 | 6/1987 | Driessen | 371/37.8 |
| 4,875,211 | 10/1989 | Murai et al. | 371/40.1 |

FOREIGN PATENT DOCUMENTS

| | | |
|---|---|---|
| 58-123144 | 7/1983 | Japan. |
| 60-7543 | 1/1985 | Japan. |
| 60-114036 | 6/1985 | Japan. |

*Primary Examiner*—Charles E. Atkinson
*Attorney, Agent, or Firm*—Stevens, Davis, Miller & Mosher

[57] ABSTRACT

An error detecting and correcting apparatus having a Galois field arithmetic unit for detecting and correcting errors in code words of a long minimum distance Reed-Solomon error correcting code used in recording/reproducing data to/from media such as an optical disk, by decoding the error correcting code. The apparatus gives a modified syndrome as an input to a generalized decoding procedure for the error correcting code free or erasure correction to obtain an error value as an intermediate value, dividing the intermediate value by the sum of error location numbers to obtain a new intermediate value, adding the sum of the new intermediate values to the product sum of syndromes and expansion coefficients of partial error location polynomial to re-compute the new intermediate value, thus successively computing the new intermediate values, and thereby providing new means to effect the generalized decoding procedure free of erasure correction even when no error location number is known in advance, to make error correction based on a computed error location number executable, along with error correction based on a known error location number.

2 Claims, 10 Drawing Sheets

FIG. I
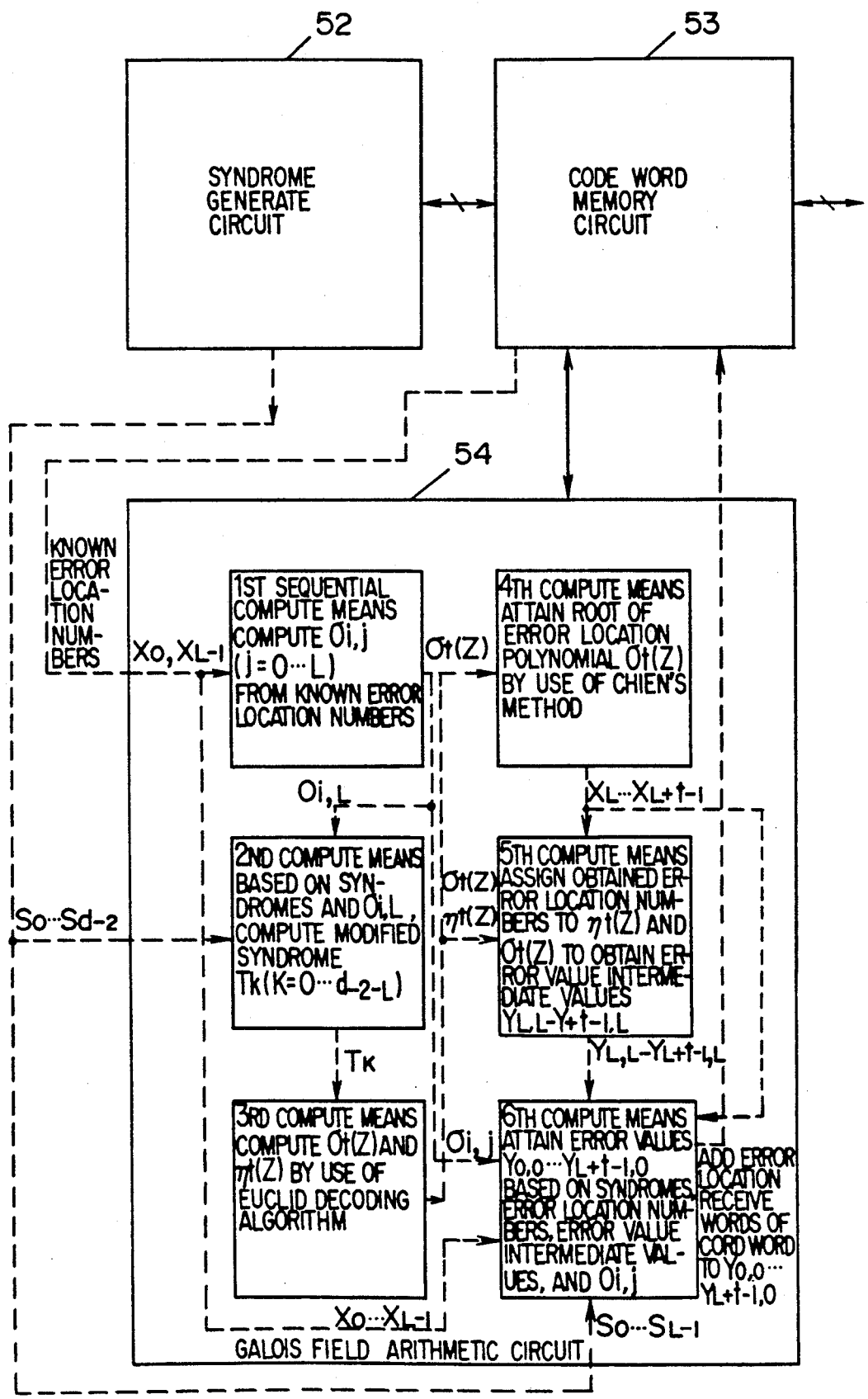

FIG. I
(c)
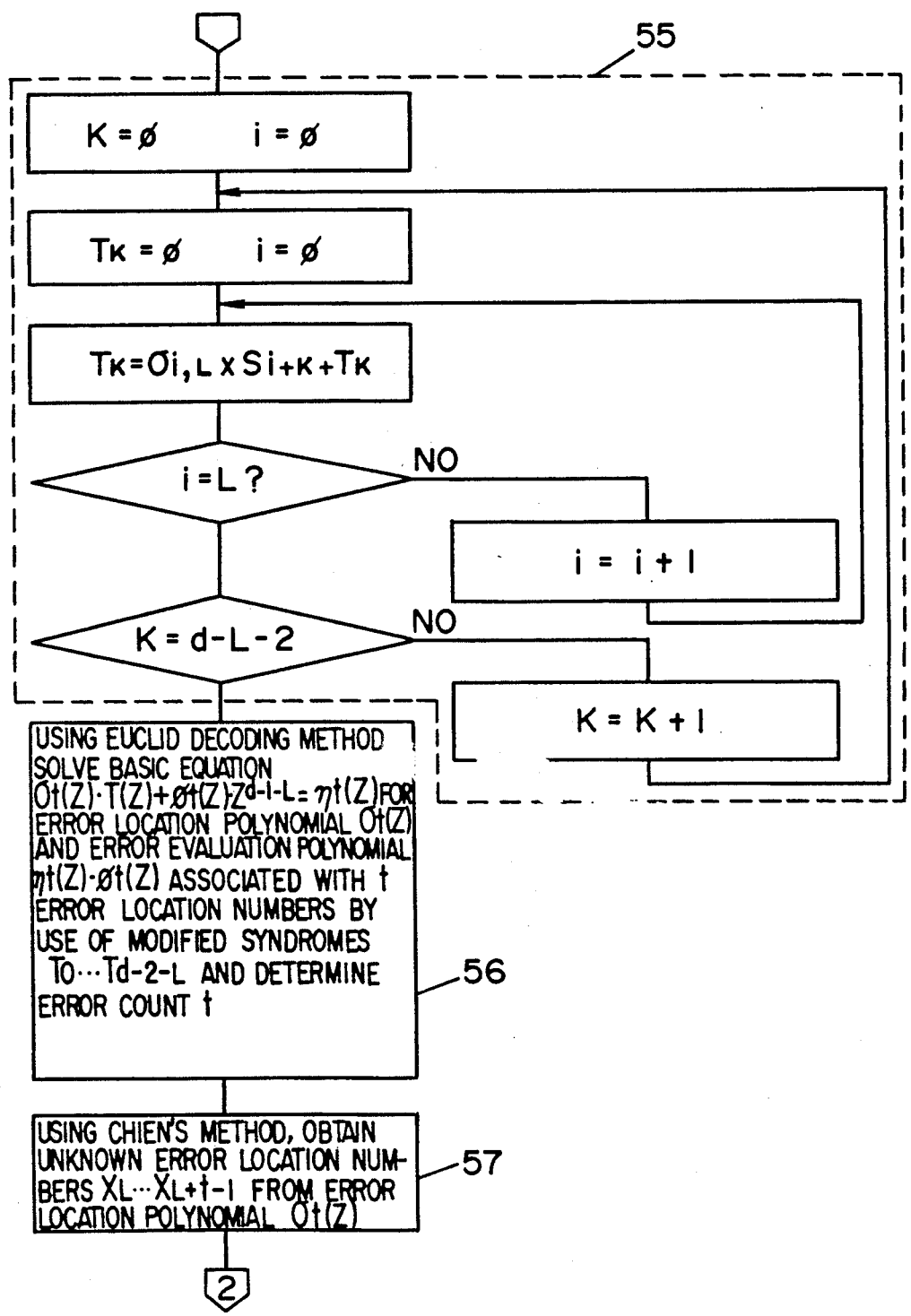

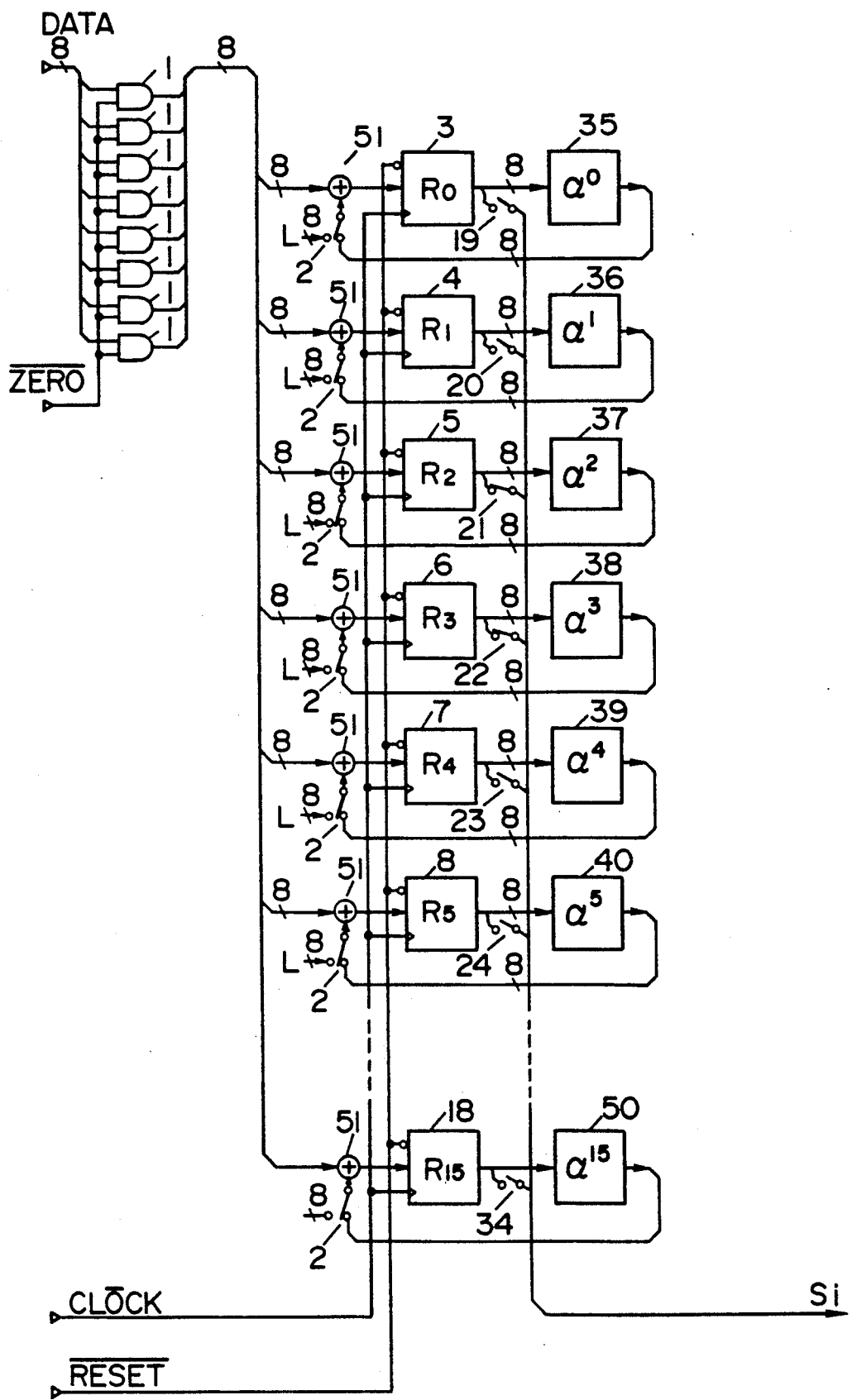
F I G. 3

ERROR CODE CORRECTION DEVICE HAVING A GALOIS ARITHMETIC UNIT

TECHNICAL FIELD

The present invention relates to a code error detection and correction apparatus for use when recording and reproducing data on a medium such as an optical disk. The apparatus is capable of ordinarily correcting an error whose location is unknown even in a code system having a large value of the minimum distance, or correcting an error at high speed whose location is known, for example, by use of an external pointer.

BACKGROUND ART

Recently, development of a data recording and playback apparatus using an optical disk has been vigorously conducted. When compared with a magnetic disk, the optical disk memory is capable of storing therein a greater amount of data; however, there exists a disadvantage that the recording medium is attended with a high raw error rate. In consequence, there has been generally known a method in which in a recording operation, a check code is added to an information code as data so as to configure a code word such that the code word is recorded as an error detection and correction code on an optical disk, so that in a playback operation, an error of the information code is detected and is corrected by use of the check code thus added thereto. As such an error detection and correction code, attention has been recently given to the Reed-Solomon code with a Hamming or minimum distance being set to about 17, d=17.

In the Reed-Solomon code above, after a parity computation by encoding data is effected as an encoding operation, the data is written in a medium together with the parity such that after reading the data therefrom, a decoding operation is effected on the data, namely, a syndrome computation, an error count estimation, a computation of coefficients for an error location polynomial, an error location computation, and an error value computation are accomplished in a sequential fashion.

In this case, the number of correctable errors is $(d-1)/2$ (ordinary correction) in a case where the error locations are unknown and is $d-1$ (erasure correction) in a case where the error locations are known. In addition, when a number L of error positions is known and there also exist errors for which the positions are unknown, the errors for which the maximum number of unknown error positions is t (where $t=(d-L-1)/2+L$) can be corrected together with the L errors for which the error positions are known.

In an article, "On Decoding BCH Codes", G. David Farney Jr., IEEE Trans. IT-11, pp. 549-557, 1965, there has been introduced, for example, a computing method of $\sigma_{i,L}$ employed to attain a modified syndrome $T_k$; however, an algorithm to obtain an error value is considerably complicated. In an item A at page 553 in the article cited above, there is described an example of an algorithm in which, based on the modified syndrome, error positions which have been unknown are obtained so as to compute coefficients of an error location polynomial together with the error location by use of a pointer; thereafter, error values are attained for the error locations or positions which have been unknown so as to obtain error values corresponding to the error locations associated with the pointer.

In general, the iterative or repeating operation is easily adapted to an erasure algorithm, and in a case of a product code often used, codes having a short distance are combined such that an error detection is achieved by use of one of the codes and an erasure correction is effected by use of the other one of the codes. Also, even for codes having a long distance, it is easier to effect the erasure correction after the error locations are obtained.

As described above, the above-cited reference discloses a method of attaining the error value for a case where both errors whose locations are known and errors whose locations are unknown are present; however, it has been known that the amount of computations is greatly increased when the minimum distance of the codes becomes large, and hence realtime correction cannot be effected in practice. In addition, although dedicated hardware may be employed to increase the operation speed, this results in too large an increase in the amount of circuitry to be practical.

DISCLOSURE OF INVENTION

It is therefore an object of the present invention to provide an error code correction device employing a Galois field arithmetic unit which can effect high-speed processing and which minimizes the amount of the hardware thereof, thereby solving the above-described problems.

In order to achieve the above object, according to the present invention, for error correction linear codes having a Hamming distance d in which the codes are constituted with a element of a Galois field (GF($2^r$)), a modified syndrome $T_K(T_o \ldots T_{d-2-L})$ is obtained by use of a syndrome associated with $S_o$ to $S_{d-2}$ and the numbers of L known error locations from $X_o$ to $X_{L-1}$, such that a procedure like that of the above-cited article is employed for computation up to a point where the unknown error locations are computed. From the $\sigma_{i,j}$ computed when the modified syndrome is obtained, the intermediate result $P_j$ is obtained from $$P_j = \sum_{i=0}^{j} \sigma_{i,j} \times S_i,$$

so that the error value is computed by use of the modified syndrome as in the ordinary correction to attain an intermediate value $$Y_{L,L} \ldots Y_{L+t-1,L}$$

so as to compute $$Y_{i,j} = \sum_{j=j+1}^{L+t-1} Y_{i,j+1}/(X_i + X_j) + P_j$$

by use of the intermediate value of the error value, the error location $x_i$ associated with the pointer, and the intermediate result $P_j$. In addition, to the subsequent $Y_{j-1,j-1}$ associated with $j-1$, the computation result attained by assuming $Y_{i,j+1}/(X_i+X_j)=Y_{i,j}$ in the right side of the formula above and the computation result $Y_{j,j}$ of the left side, thereby finally attaining the error values $Y_0 \ldots, Y_{L-1} \ldots Y_{L-1+t}$.

According to the present invention, in the encoding or decoding operation of the Reed-Solomon code by use of the procedure described above, after the syndrome of the code word is computed, there are given a location assumed to be associated with an error and a known error location indicated by the pointer so as to achieve a repeating operation including a sequence of the multiplication, division, and addition of a Galois field, thereby conducting an error correction including an encoding or erasure of the check code. Since the number of computations of this procedure is greatly reduced as compared with the conventional method, this procedure is applicable to a case where realtime processing is required; moreover, the amount of required circuitry is considerably reduced, which also facilitate the above processing.

BRIEF DESCRIPTION OF DRAWINGS

FIG. 3 is a circuit diagram showing details of a syndrome generating circuit.

BEST MODE FOR CARRYING OUT THE INVENTION

Figure 1:
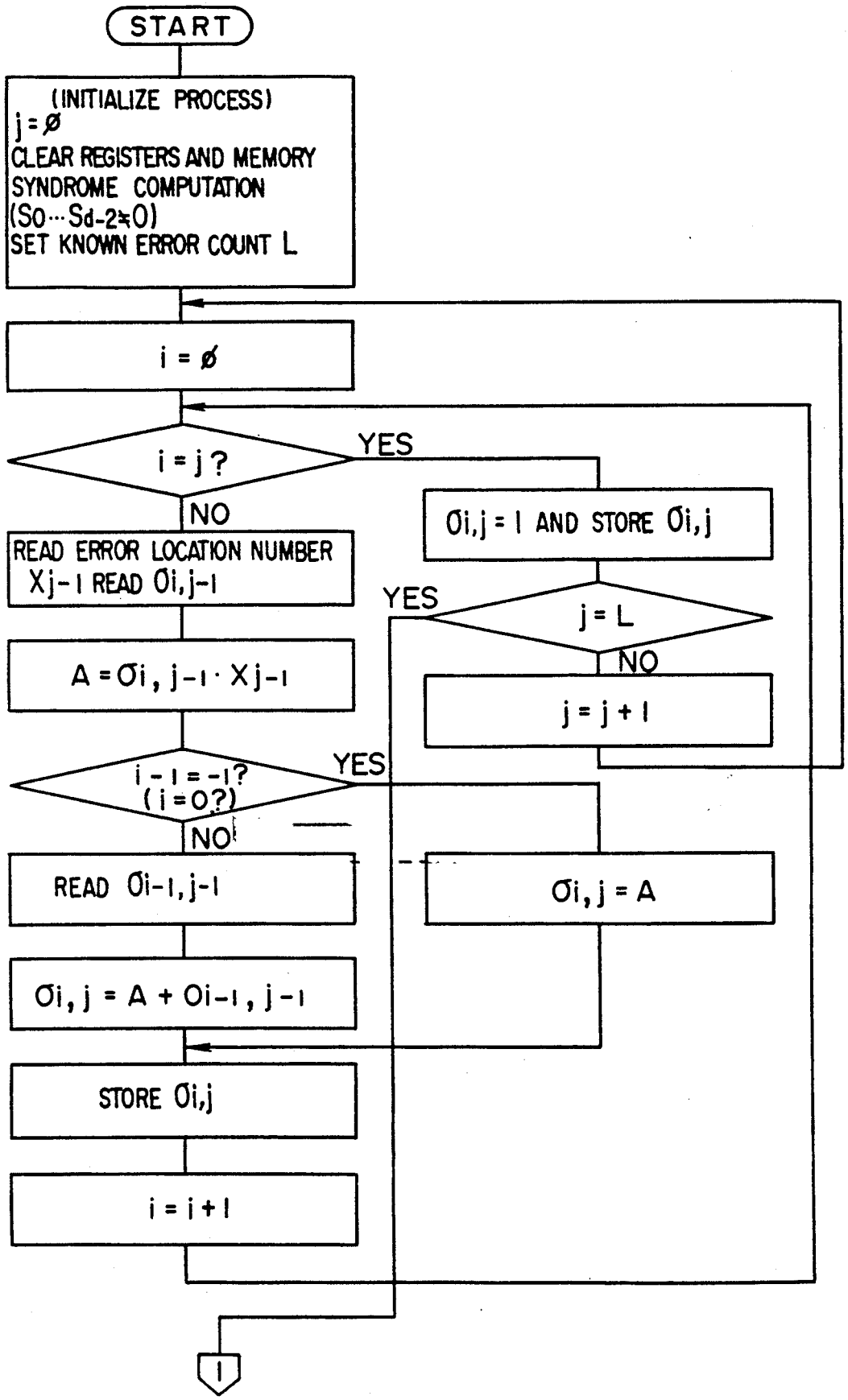
FIG. 1a is a block diagram showing a first embodiment according to the present invention.
FIG. 1b is a flowchart showing the operation of a first compute means employed in the first embodiment of FIG. 1a, FIG. 1c is a flowchart showing operations of second, third, and fourth compute means adopted in the first embodiment of FIG. 1a, and FIGS. 1d and 1e are flowcharts showing operations of fifth and sixth compute means adopted in the first embodiment of FIG. 1a. In addition.
Figure 1:
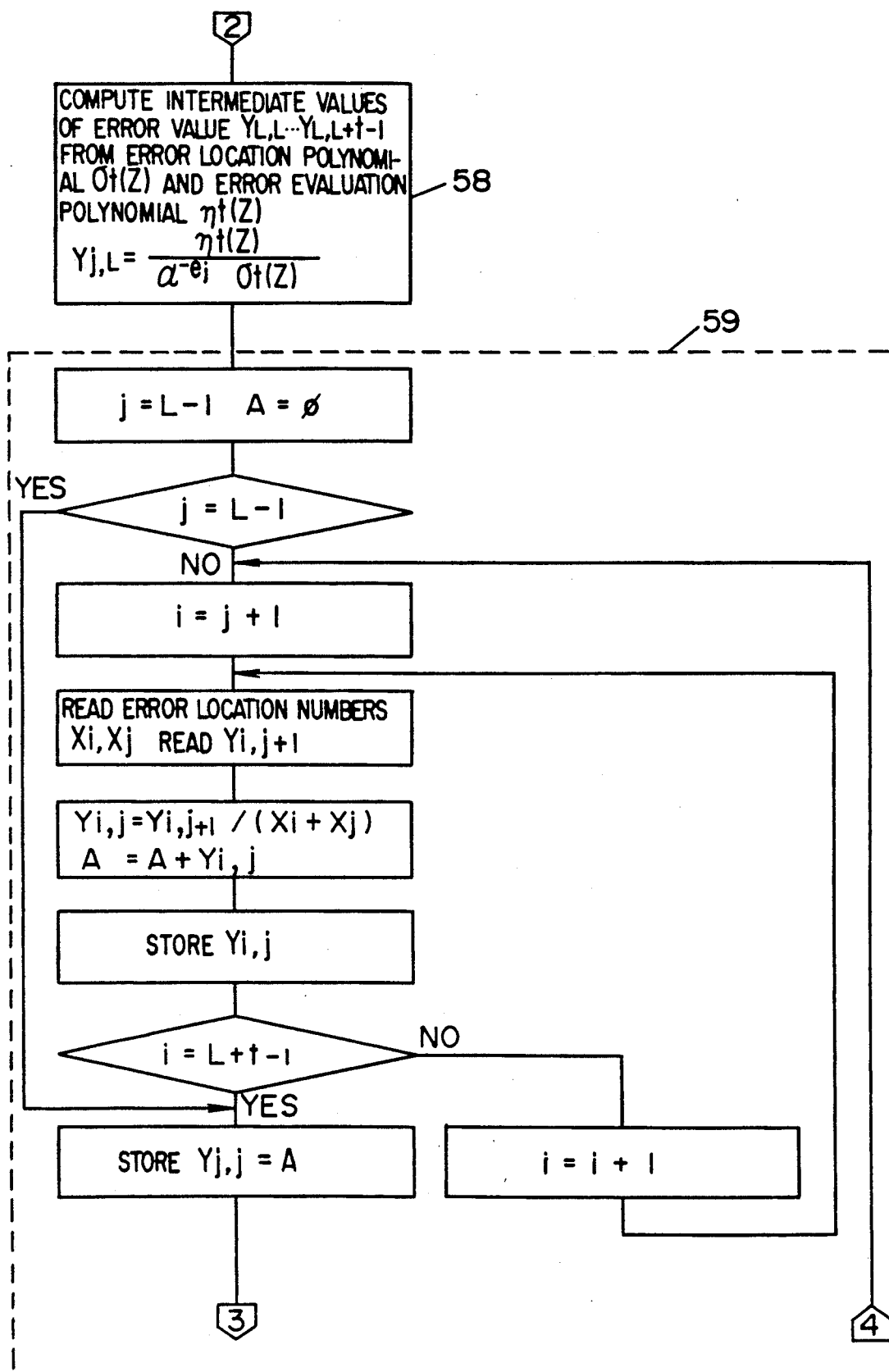
Figure 1:
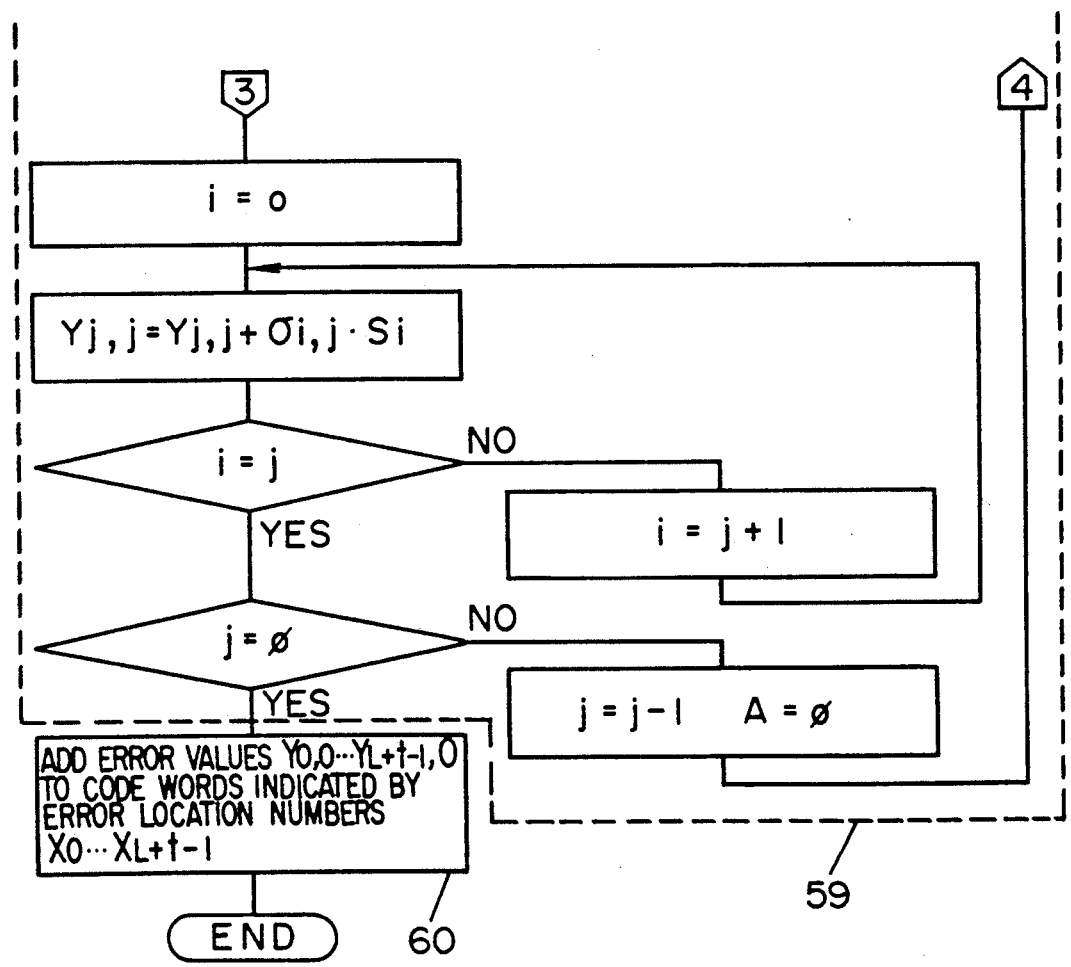

Referring now to the drawings, description will be given of an error code correcting device employing a Galois field arithmetic unit as an embodiment according to the present invention.

FIG. 1a is a block diagram of a first embodiment according to the present invention. FIG. 1b is a flowchart showing the operation of a first compute means employed in the first embodiment of FIG. 1a. In addition, FIG. 1c is a flowchart showing operations of second, third, and fourth compute means adopted in the first embodiment of FIG. 1a. Furthermore, FIGS. 1d and 1e are flowcharts showing operations of a fifth compute means adopted in the first embodiment of FIG. 1a.

In FIG. 1a, 52 indicates a syndrome generating circuit and 53 is a code word memory circuit. Reference numeral 54 designates a Galois field arithmetic circuit for executing operations of a Galois field by use of a microprogram at a high speed. In addition, a signal detection circuit in an optical disk drive detects a drop out so as to effect a detection thereof with an error location to be associated with a pointer. For the error location, a value of an error location counter operative according to a code recording format in a decoding is written from an input/output bus of the code word memory circuit 54 in a vector representation. Moreover, the code word memory circuit 53 is connected via an input/output bus to a decode circuit and a modulation circuit in the optical disk drive or to a host computer interface circuit.

FIG. 3 is a circuit diagram showing details of the syndrome generating circuit.

The configuration of FIG. 3 includes a logical product gate circuit 1 associated with a total of eight bits, an input change-over switch logic circuit 2, 0-th to fifth 8-bit register circuits 3 to 8, a 15-th 8-bit register circuit 18, 0-th to fifth change-over switch logic circuits 19 to 24, 15th switch logic circuit 34, and $\alpha^0$ to $\alpha^5$ Galois field multiply circuits 35 to 40. In addition, 51 denotes a Galois field add circuit (exclusive OR logical sum gate circuit). In FIG. 3, sixth to 14th circuit components are omitted.

Next, a description will be provided of the operation of the syndrome generate circuit. In this example, the operation is accomplished in GF($2^8$).

First, a receive word sent from the decode circuit is fed to and is then stored in the code word memory circuit 53 for a decoding operation thereof. Thereafter, the receive word is fed from the code word memory circuit 53 to the syndrome generate circuit 52. An initial setup is beforehand effected by means of the logical product gate 1 and the input change-over switch logic circuit 2 so that the contents of the 8-bit register circuits 3 to 18 include 0 element.

Subsequently, the receive word of n symbols from the decode circuit accumulated in the code word memory circuit 53 is inputted via a data terminal to the logical product gate circuit 1. The logical product gate circuit 1 is activated when data is supplied from the data terminal. Outputs therefrom are fed to the Galois field add circuit 51 (exclusive OR logic unit), and at the same time, the input change-over switch circuit 2 is changed over so that the outputs are added to values of multiplication results fed back from the Galois field multiply circuits 35 to 50, thereby completing input operations of n symbols.

Thereafter, the contents of the 8-bit registers 3 to 18 are selected through the change-over switch logic circuits 19 to 34 so as to attain syndromes $S_0$ to $S_{15}$.

In this embodiment, since there is adopted a Reed-Solomon code of the Hamming distance d=17, the number of syndromes is d−2, namely, 15 symbols. The syndromes $S_0$ to $S_{15}$ are supplied to the Galois field arithmetic circuit 54.

The Galois field arithmetic circuit 54 includes first to sixth compute means.

In the first compute means, known error loation numbers $X_0$ to $X_{L-1}$ are received as pointers from the code word memory circuit 53 so as to compute $\sigma_{i,j}$ and then to store the computed result. The value of $\sigma_{i,j}$ is used in a process to attain the modified syndrome $T_k$ and the error value $Y_{j,o}$. Details about the operations are shown in the flowchart of FIG. 1b.

In the second compute means, based on the value of $\sigma_{i,j}$ attained from the first compute means and the syndrome read from the syndrome generate circuit 52, the modified syndrome $T_k$ is computed. Details about this operation are shown in a flowchart 55 of FIG. 1c.

In the third compute means, the error location polynomial $\sigma_r(z)$ and the error evaluation polynomial $\eta_r(z)$ are obtained from the modified syndrome determined in the second compute means. Details about this operation are shown in a flowchart 56 of FIG. 1c.

In addition, the fourth compute means is used to obtain the unknown error location numbers $X_L \ldots X_{L+t-1}$ from the error location polynomial $\sigma_r(z)$ determined by the third compute means, which corresponds to a portion 57 of the flowchart of FIG. 1b.

The fifth compute means is a section to obtain the error value intermediate values $Y_{L,L} \ldots Y_{L,L+t-1}$ by assigning the error locations attained by the fourth compute means to the error evaluation polynomial $\eta_t(z)$, which corresponds to the flowchart 58 of FIG. 1b.

The sixth compute means is employed to compute the error value $Y_{i,0}$ from $\sigma_{i,j}$ attained by the first compute means and the error value intermediate values $Y_{L,L} \ldots Y_{L,L+t-1}$ determined by the fifth compute means, and details thereabout are shown in FIGS. 1d and 1e. A portion 59 of the flowchart of FIG. 1d and a portion 59 of the flowchart of FIG. 1e respectively show the first and second halves of the computation of the error value $Y_{i,0}$. A reference numeral 60 indicates a flowchart portion to conduct a final error correction. In this process, the error location numbers are converted from the vector representation into the power expression such that an address is presented in the code word memory circuit 53 so as to read an error symbol to be added to the computed error value, thereby writing the resultant value again in the same position of the code word memory circuit 53.

Details of the operations of the first embodiment of the Galois field arithmetic unit configured as described above will be described with reference to FIGS. 1a to 1e and FIG. 3.

Assume here that a total of nine values exist for the objective error values $Y_{j,0}$, namely, errors of $J=8$ to 6 for which the error locations are unknown and errors of $j=5$ to 0 for which the error locations are known. Under conditions that $0 \leq j \leq L$ and $J \geq i \geq 0$ for j and that variables for which the subscript does not satisfy the inequality on the right side are 0, assuming $\sigma_{j,j}=1$, such that for $$\sigma_{i,j} = \sigma_{i,j-1} \times X_{j-1} + \sigma_{i-1,j-1}$$

j is varied from 0 to L and for each value of j, i is changed under the conditions above so as to sequentially effect the computation procedure, thereby storing the resultant $\sigma_{i,j}$. This is because for the computation of $\sigma_{i,j}$, it is necessary to adopt the values of $\sigma_{i,j-1}$ and $\sigma_{i-1,j-1}$ attained in the previous process and because this $\sigma_{i,j}$ is necessary when the error value is to be computed.

Next, based on the $\sigma_{i,j}$ thus obtained and the syndrome, computation is achieved for the modified syndrome $$T_k = \sum_{i=1}^{L} \sigma_{i,j} \times S_{k+1}$$

for the values of k ranging from 0 to $d-2-L$, such that by handling the $T_k$ like the syndrome in the ordinary error correction of errors for which the error location numbers are unknown, there are obtained through the Euclid decoding algorithm an error location polynomial $\sigma_t(z)$ for t errors associated with unknown error location numbers and an error evaluation polynomial $\eta_t(z)$ of the intermediate value of the error value. Thereafter, the error locations attained through the Chien's algorithm to compute the error location numbers from the error location polynomial are assigned to the error location polynomial $\sigma_t(z)$ and an error evaluation polynomial $\eta_t(z)$ of the intermediate value of the error value so as to obtain the error value intermediate values $Y_{L+t-1,L} \ldots Y_{L,L}$, thereby determining the error value from the flowchart 59. In the operations above, there are employed computation formulas for the respective values as follows.

$$Y_{5,5} = Y_{8,6}/(X_8+X_5) + Y_{7,6}/(X_7+X_5) + Y_{6,6}/(X_6+X_5) + P_5$$

where, $$P_5 = S_5 + \sigma_{4,5} \times S_4 + \sigma_{3,5} \times S_3 + \sigma_{2,5} \times S_2 + \sigma_{1,5} \times S_1 + \sigma_{0,5} \times S_0$$

$$\sigma_{4,5} = X_0 + X_1 + X_2 + X_3 + X_4$$
$$= 1 + X_4 + \sigma_{3,4}$$

$$\sigma_{3,5} = (X_0 + X_1 + X_2 + X_3) \times X_4 + (X_0 + X_1 + X_2) \times X_3 + (X_0 + X_1) \times X_2 + X_0 \times X_1$$
$$= \sigma_{3,4} \times X_4 + \sigma_{2,4}$$

$$\sigma_{2,5} = ((X_0 + X_1 + X_2) \times X_3 + (X_0 + X_1) \times X_2 + X_0 \times X_1) \times X_4 + (X_0 + X_1) \times X_2 + X_0 \times X_1) \times X_3 + X_0 \times X_1 \times X_2$$
$$= \sigma_{2,4} \times X_4 + X_{1,4}$$

$$\sigma_{1,5} = (((X_0 + X_1) \times X_2 + X_0 \times X_1) \times X_3 + X_0 \times X_1 \times X_2) \times X_4 + X_0 \times X_1 \times X_2 \times X_3$$
$$= \sigma_{1,4} \times X_4 + \sigma_{0,4}$$

$$\sigma_{0,5} = X_0 \times X_1 \times X_2 \times X_3 \times X_4$$
$$= \sigma_{0,4} \times X_4 + O$$

$$Y_{4,4} \times Y_{8,5}/(X_8+X_4) + Y_{7,5}/(X_7+X_4) + Y_{6,5}/(X_6+X_4) + Y_{5,5}/(X_5+X_4) + P_4$$

where, $$Y_{8,5} = Y_{8,6}/(X_8+X_5)$$

$$Y_{7,5} = Y_{7,6}/(X_7+X_5)$$

$$Y_{6,5} = Y_{6,6}/(X_6+X_5)$$

$$P_4 = S_4 + \sigma_{3,4} \times S_3 + \sigma_{2,4} \times S_2 + \sigma_{1,4} = S_1 + \sigma_{0,4} \times S_0$$

$$\sigma_{3,4} = X_0 + X_1 + X_2 + X_3$$
$$= 1 \times X_3 + \sigma_{2,3}$$

$$\sigma_{2,4} = (X_0 + X_1 + X_2) \times X_3 + (X_0 + X_1) \times X_2 + X_0 \times X_1$$
$$= \sigma_{2,3} \times X_3 + \sigma_{1,3}$$

$$\sigma_{1,4} = ((X_0 + X_1) \times X_2 + X_0 \times X_1) \times X_3 + X_0 \times X_1 \times X_2$$
$$= \sigma_{1,3} \times X_3 + \sigma_{0,3}$$

$$\sigma_{0,4} = X_0 \times X_1 \times X_2 \times X_3$$
$$= \sigma_{0,3} \times X_3 + O$$

$Y_{3,3} = Y_{8,4}/(X_8+X_3) + Y_{7,4}/(X_7+X_3) + Y_{6,4}/(X_6+X_3)$
$+ Y_{5,4}/(X_5+X_3) + Y_{4,4}/(X_4+X_3) + P_3$ where, $Y_{8,4} = Y_{8,5}/(X_8+X_4)$ $Y_{7,4} = Y_{7,5}/(X_7+X_4)$ $Y_{6,4} = Y_{6,5}/(X_6+X_4)$ $Y_{5,4} = Y_{5,5}/(X_5+X_4)$ $P_3 \times S_3 + \sigma_{2,3} \times S_2 + \sigma_{1,3} \times S_1 + \sigma_{0,3} = S_0$ $\sigma_{2,3} = X_0 + X_1 + X_2$
$= 1 \times X_2 + \sigma_{1,2}$ $\sigma_{1,3} = (X_0 + X_1) \times X_2 + X_0 \times X_1$
$= \sigma_{1,2} \times X_2 + \sigma_{0,2}$ $\sigma_{0,3} = X_0 \times X_1 \times X_2$
$= \sigma_{0,2} \times X_2 + O$ $Y_{2,2} = Y_{8,3}/(X_8+X_2) + Y_{7,3}/(X_7+X_2) + Y_{6,3}/(X_6+X_2)$
$+ Y_{5,3}/(X_5+X_2) + Y_{4,3}/(X_4+X_2)$
$+ Y_{3,3}/(X_3+X_2) + P_2$ where, $Y_{8,3} = Y_{8,4}/(X_8+X_3)$ $Y_{7,3} = Y_{7,4}/(X_7+X_3)$ $Y_{6,3} = Y_{6,4}/(X_6+X_3)$ $Y_{5,3} = Y_{5,4}/(X_5+X_3)$ $Y_{4,3} = Y_{4,4}/(X_4+X_3)$ $P_2 = S_2 + \sigma_{1,2} \times S_1 + \sigma_{0,2} \times S_0$ $\sigma_{1,2} = X_0 + X_1$
$= 1 \times X_1 + \sigma_{0,1}$ $\sigma_{0,2} = X_0 \times X_1$
$= \sigma_{0,1} \times X_1 + O$ $Y_{1,1} = Y_{8,2}/(X_8+X_1) + Y_{7,2}/(X_7+X_1) + Y_{6,2}/(X_6+X_1)$
$+ Y_{5,2}/(X_5+X_1) + Y_{4,2}/(X_4+X_1)$
$+ Y_{3,2}/(X_3+X_1) + Y_{2,2}/(X_2+X_1) + P_1$ where, $Y_{8,2} = Y_{8,3}/(X_8+X_2)$ $Y_{7,2} = Y_{7,3}/(X_7+X_2)$ $Y_{6,2} = Y_{6,3}/(X_6+X_2)$ $Y_{5,2} = Y_{5,3}/(X_5+X_2)$ $Y_{4,2} = Y_{4,3}/(X_4+X_2)$ $Y_{3,2} = Y_{3,3}/(X_3+X_2)$ $P_1 = S_1 + \sigma_{0,1} \times S_0$ $\sigma_{0,1} = X_0$ $Y_{0,0} = Y_{8,1}/(X_8+X_0) + Y_{7,1}/(X_7+X_0) + Y_{6,1}/(X_6+X_0)$
$+ Y_{5,1}/(X_5+X_0) + Y_{4,1}/(X_4+X_0)$
$+ Y_{3,1}/(X_3+X_0) + Y_{2,1}/(X_2+X_0)$
$+ Y_{1,1}/(X_1+X_0) + P_0$ where, $Y_{8,1} = Y_{8,2}/(X_8+X_1)$ $Y_{7,1} = Y_{7,2}/(X_7+X_1)$ $Y_{6,1} = Y_{6,2}/(X_6+X_1)$ $Y_{5,1} = Y_{5,2}/(X_5+X_1)$ $Y_{4,1} = Y_{4,2}/(X_4+X_1)$ $Y_{3,1} = Y_{3,2}/(X_3+X_1)$ $Y_{2,1} = Y_{2,2}/(X_2+X_1)$ $P_0 = S_0$ At intermediate points of the 0-th error value $Y_{0,0}$ attained here, other error values, namely, the first to eighth values are obtained at the same time as follows.

$Y_{1,0} = Y_{1,1}/(X_1+X_0)$, $Y_{2,0} = Y_{2,1}/(X_2+X_0)$, $Y_{3,0} = Y_{3,1}/(X_3+X_0)$, $Y_{4,0} = Y_{4,1}/(X_4+X_0)$, $Y_{5,0} = Y_{5,1}/(X_5+X_0)$, $Y_{6,0} = Y_{6,1}/(X_6+X_0)$, $Y_{7,0} = Y_{7,1}/(X_7+X_0)$, $Y_{8,0} = Y_{8,1}/(X_8+X_0)$,

Incidentally, $$P_j = \sum_{i=1}^{j} \sigma_{i,j} \times S_i$$

has been assumed in this computation. As described above, in order to obtain $Y_{j,0}$, the computation of $Y_{j,j}$ is accomplished in a range of j from $L-1$ to 0.

Also in a case where, for attaining the error value, the computation of $Y_{j,j}$ is accomplished according to the formula of $$Y_{j,j} = \sum_{i=j+1}^{L+t-1} Y_{i,j+1}/(X_i + X_j) + \sum_{i=0}^{j} \sigma_{i,j} \times S_i,$$

like in the computation of $\sigma_{i,j}$, it is required to use a computation result of $Y_{i,j+1}$, namely, $Y_{i,j} = Y_{i,j+1}/(X_i + Y_j)$ associated with j+1 of a previous process in the computation process of $Y_{j,j}$ in a range of j from the maximum value of $L-1$ to 0. In consequence, when $Y_{i,j+1}/(X_i + Y_j)$.

is computed, the result is to be stored in the memory in any case such that in the subsequent process, the content of the memory is read therefrom so that the updated value is written again therein. It is convenient to achieve the sequential computations in the procedure described above. The new result of the $Y_{j,j}$ thus attained is also written in the memory. When j=0 results in the repetitious computations as describe above, $Y_{j,0}$, namely, the error value is stored in the memory. Furthermore, in an operation to obtain the error value, the $\sigma_{i,j}$ already determined is read out again so as to be used in the computation.

Incidentally, in the computation of $Y_{j,j}$, it is effective to achieve a multiplication of $1/(X_i+Y_j)$ by use of a reprocical ROM.

Referring next to the drawings, a description will be provided of the Galois field arithmetic unit as a second embodiment according to the present invention.

Figure 2:
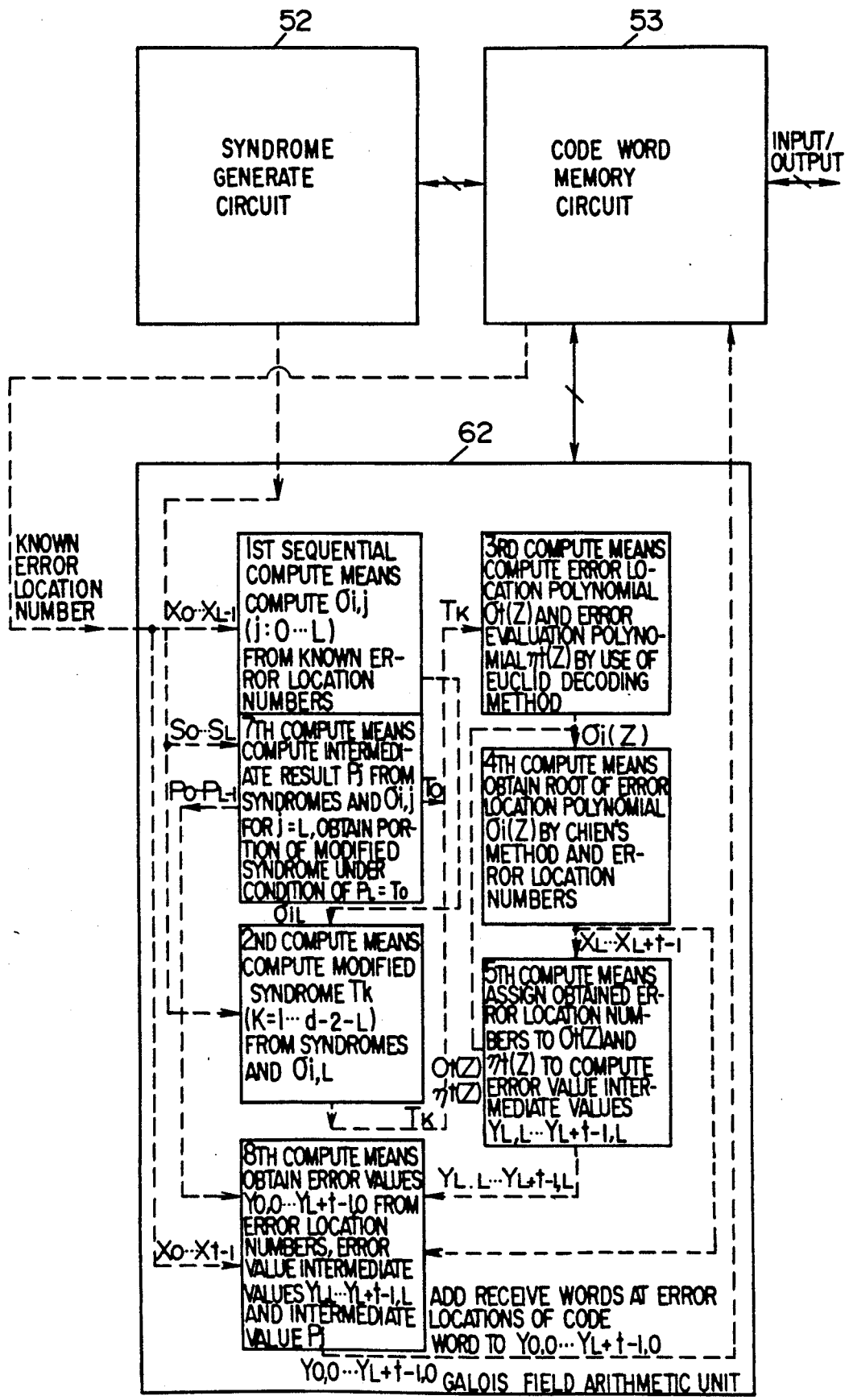
FIG. 2a is a block diagram showing a second embodiment according to the present invention.
FIG. 2b, is a flowchart showing operations of first and seventh compute means adopted in the second embodiment of FIG. 2a, and FIG. 2c is a flowchart showing operations of second, third, and fourth compute means adopted in the second embodiment of FIG. 2a. Furthermore.
FIG. 2d is a flowchart showing operations of fifth and eighth compute means adopted in the second embodiment of FIG. 2a. In addition.
Figure 2:
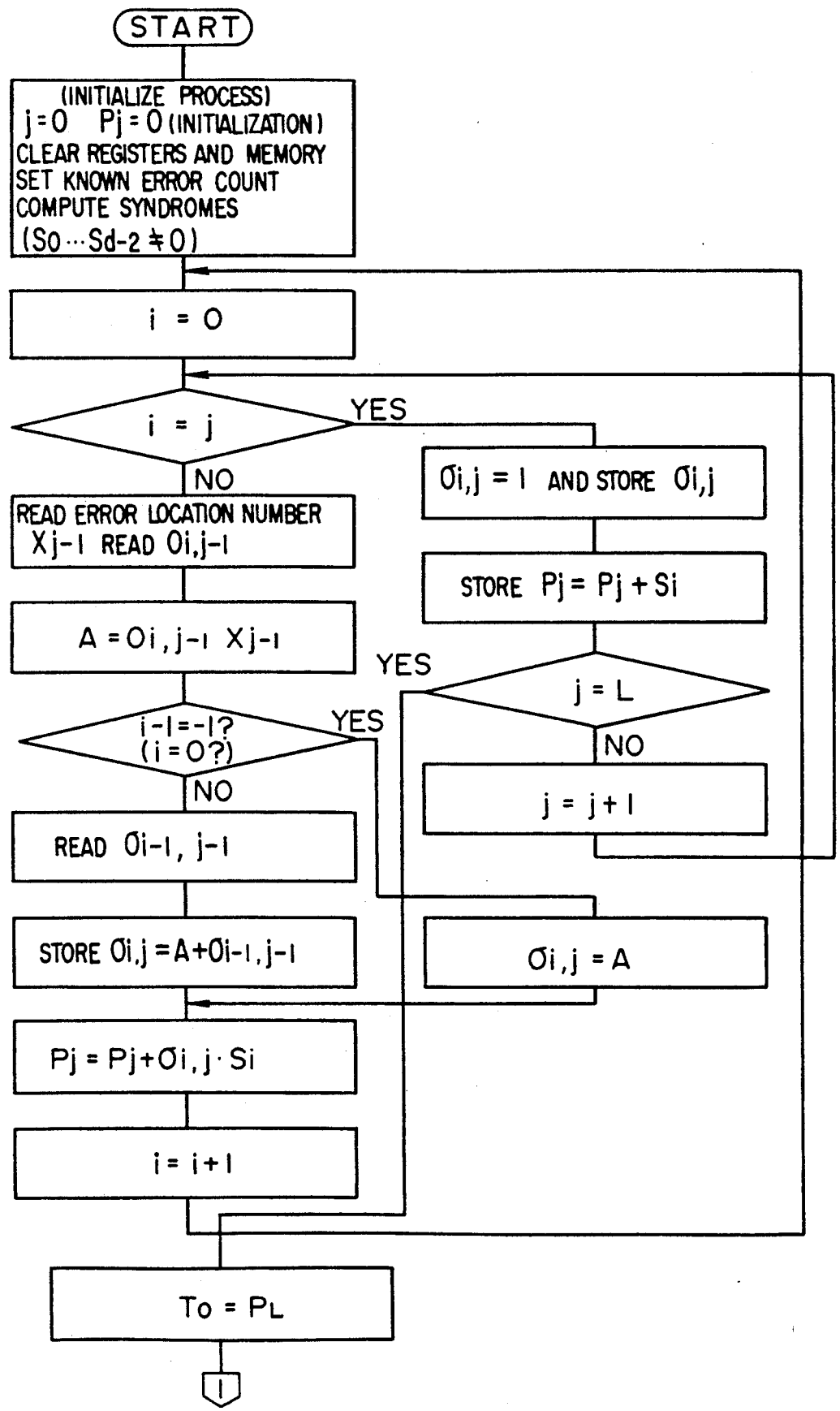
Figure 2:
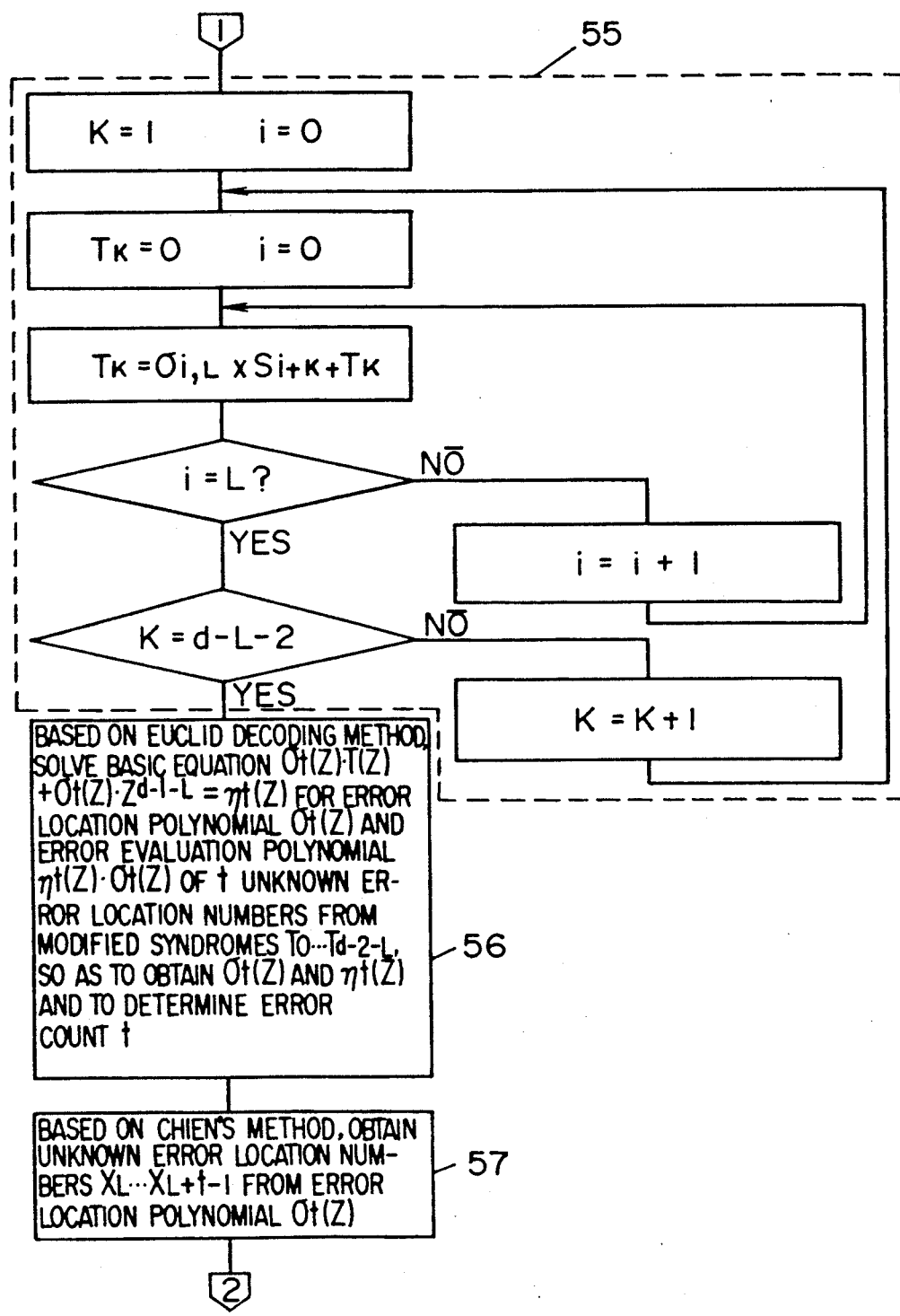
Figure 2:
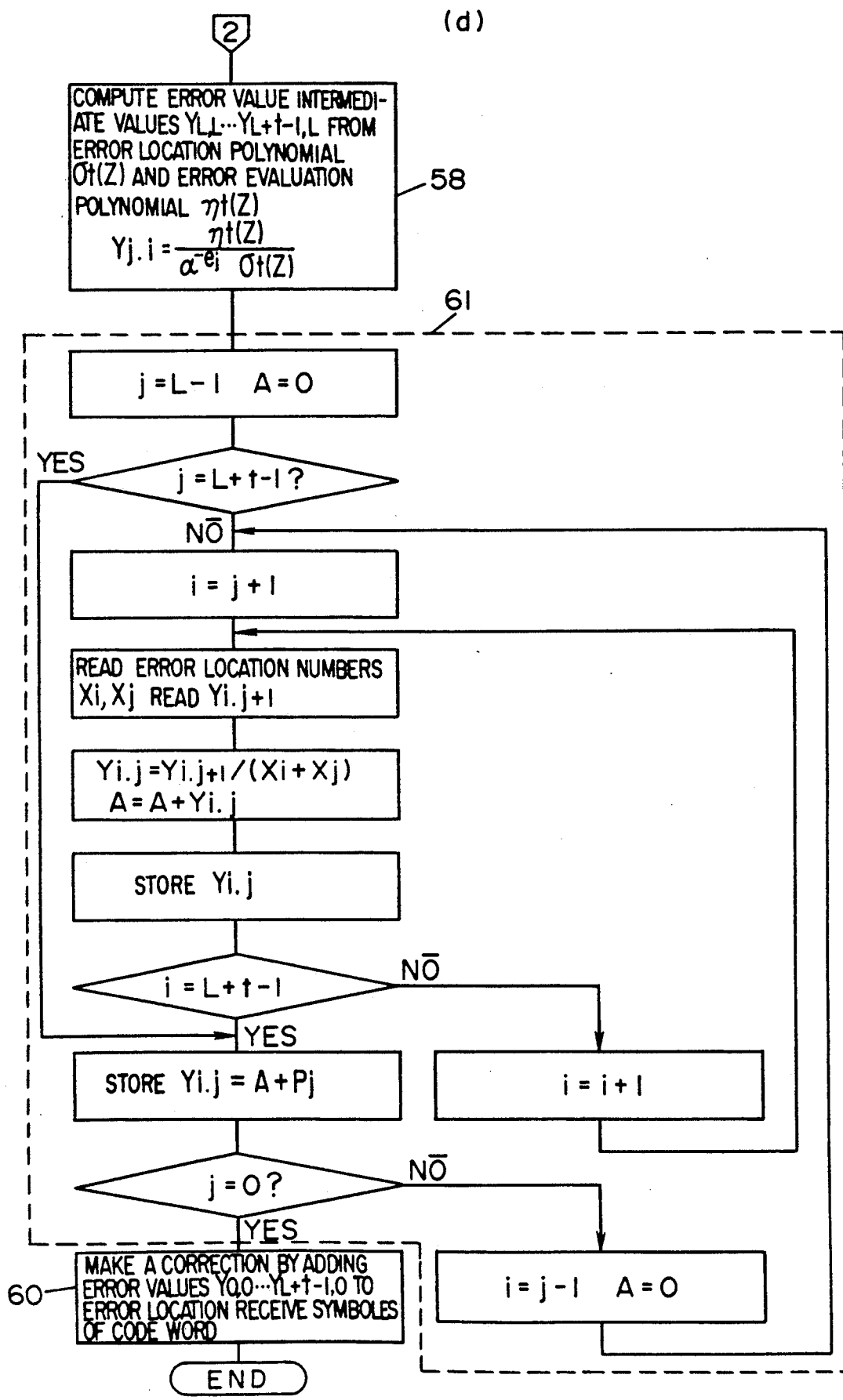

FIG. 2a is a block diagram of the second embodiment according to the present invention. FIG. 2b is a flowchart showing the operations of the first and seventh compute means of the second embodiment and FIG. 2c is a flowchart showing the operations of the second, third, and fourth compute means of the second embodiment, which is basically idential to the flowchart of FIG. 1c; however, in a flowchart portion 55, the computation of the correction syndrome $T_0$ is not achieved because the computation has already been completed. In addition, FIG. 2d is a flowchart showing the operations of the fifth and eighth compute means of the second embodiment. In FIG. 2a, 52 is a syndrome generate circuit, which is identical to that shown in FIG. 3 and 53 indicates a code word memory circuit. Furthermore, 62 designates a Galois field arithmetic circuit which executes operations of a Galois field by use of a microprogram at a high speed.

In FIG. 2b, the first and seventh compute means are combined in this application such that $\sigma_{i,j}$ computed in the first compute means is kept in the register so as to be multiplied by $S_i$, thereby computing the intermediate value $P_j$ and a portion $T_0$ of the correction syndrome to be stored thereafter.

Furthermore, in FIG. 2c, the correction syndromes $T_1, \ldots, T_{d-L-2}$ are obtained in the similar manner to that employed in FIG. 1c such that the Euclid decoding method of 56 is effected to attain an error location polynomial $\sigma_t(z)$ associated with t errors for which the error location numbers are unknown and an error evaluation polynomial $\eta_t(z)$ of the intermediate value of the error value to be attained. Thereafter, by effecting a flowchart 58 of FIG. 2d in which the error locations determined through the Chien's algorithm of 57 are assigned to the error location polynomial $\sigma_t(z)$ and an error evaluation polynomial $\eta_t(z)$ of the intermediate value of the error value to be attained, the intermediate values of the error value $Y_{L+t-1,L} \ldots Y_{L,L}$ are obtained so as to determine the error value by use of a flowchart 61.

In 61 of FIG. 2d, the error value $Y_{j,0}$ is finally computed from the intermediate value $P_j$ and the error location numbers stored by use of the seventh compute means of FIG. 1b.

Referring to FIGS. 2a to 2d and FIG. 3, description will be given of a method employed in the second embodiment of the Galois field arithmetic unit configured as described above.

It is assumed that for the error values $Y_{j,0}$, there exist nine values associated with errors for J=8 to 6 for which the error locations are unknown and errors for j=5 to 0 for which the error location are known.

For the computation formula of the respective values, like in the first embodiment, in order to obtain $Y_{j,0}$, the computation of $Y_{j,j}$ is conducted for a range of j from L−1 to 0; however, prior to this computation, it is advantageous and more efficient to obtain the value of $P_{j-1}$ from the intermediate value $P_0$. That is, when attaining $P_j$, the computation procedure of $\sigma_{i,j}$ is set as $$\sigma_{i,j} = \sigma_{i,j-1} \times X_{j-1} + \sigma_{i-1,j-1}$$

such that at the same time, from the attained $\sigma_{i,j}$ and the syndrome $S_i$, the following computation is achieved.

$$P_j = \sum_{i=0}^{j} \sigma_{i,j} \times S_i$$

The intermediate value $P_j$ thus obtained is stored in another location of the memory. Incidentally, the L-th intermediate value is determined here as follows.

$$P_L = T_0 = \sum_{j=0}^{L} \sigma_{i,L} \times S_i$$

Subsequently, like the case of the first embodiment, the remaining modified syndromes and intermediate values of error value $Y_{L+t-1,L} \ldots Y_{L,L}$ are attained so as to compute the following formula.

$$Y_{j,j} = \sum_{i=j+1}^{L+t-1} Y_{i,j+1}/(X_i + X_j) + P_j$$

Also in this case, in a similar fashion to that of the first embodiment, there is employed $Y_{i,j+1}$, namely, the computation result of a preceding process in the $Y_{j,j}$ in the range of j from the maximum value L−1 to 0 as follows.

$$Y_{i,j} = Y_{i,j+1}/(X_i+X_j)$$

In the sequential computation above, when j=0 results, the memory is loaded with $Y_{j,0}$, namely, the objective error value. In a case where the error location numbers are known by use of other means as described above, the erasure correction can be effectively accomplished by using the location numbers in the computation formula; and in a range where the code distance is acceptable, the correction can be systematically accomplished through the procedure described above. As the computation in this procedure, there are required $1.5 \times L^2 + t^2$ multiply operations.

Incidentally, in the first embodiment according to the present invention, the multiplication of the 0 element can be omitted by assuming that the result is the 0 element, which is also the case for the multiplication of one. In addition, one option is to assign values while achieving the condition judgement, for example, the 0 element is adopted at an intermediate point of the computation in place of an operation to set the initial value. Furthermore, when a sequential computation is to be conducted, it is possible to effect the computation with some results kept in devices such as registers. Moreover, these computations may be executed by use of an ordinary microprocessor, and since the multiplication of a Galois field is ordinarily carried out by use of a logarithmic table, the algorithm according to the present invention is particularly efficient in the computation. Incidentally, for the parity computation in the encoding operation as well as for the syndrome computation, a considerably high-speed processing is required, and hence also in a case where such processing is effected by the software, there is employed a hardware achieving a parallel operations in many cases. Even in a case where a high-speed processing is necessary, it is also possible to achieve these processing operations including the correction in a software at a speed similar to the speed of the hardware by use of a microprogramming scheme, namely, the processing need not be effected in a purely hardware.

If an erasure correction is conducted in a case where the receive information words up to $c'_{n-1}, c'_{n-2} \ldots c'_{d-1}$ are correct and 0 element errors take place in $c'_{d-1}, c'_{d-3} \ldots c'_0$ associated with $d-1$ parity words to be generated and are lost as a result, the decoding operation effected by inputting the 0 element on assumption that the error location numbers designate parity positions is exactly equivalent to an operation to accomplish an encoding operation on the information words. That is, if the erasure correction can be carried out by a microprogram at a high speed, it is also possible to achieve a encoding operation at the similar speed. In this situation, when the check word is to be supplied to the syndrome generate circuit of FIG. 3, the 0 element need only be inputted after setting the logical product gate circuit 1 to the active state. In this case, it is assumed that the number t of the unknown errors is 0 and the number L of the known errors is $d-1$. In this fashion, only the syndrome compute circuit may be implemented by dedicated hardware so as to omit the encoding circuit.

INDUSTRIAL APPLICABILITY

As described above, according to the present invention, it is possible to execute the ordinary correction and the erasure correction at a high speed by use of the syndrome generate circuit and the code word memory circuit in the code error detect and correct apparatus. In consequence, a decoding operation can be practically accomplished on a recording medium having a high value of the raw error rate in an apparatus such as an optical disk device requiring a high speed operation and a high performance, which leads to a significant advantageous effect.

We claim:

1. An error code correction apparatus provided with a Galois field arithmetic unit for correcting errors produced in code words by use of inputted error correcting codes, constituted of elements of a Galois field $GF(2^r)$ wherein r-bit binary data constitute a symbol having a minimum distance d and including post-reception errors, and location numbers ranging from $X_0$ to $X_{L-1}$ whose error locations are partially known out of all the locations of errors produced in said received error correcting codes, comprising:

a syndrome generating circuit for generating $d-1$ syndromes ranging from $S_0$ to $S_{d-2}$ by product-summing code word information symbol locations with coefficients predetermined in response to the code word information symbol locations;

a first compute means for attaining the expansion coefficients $\sigma_{i,j}$ for error location polynomials ranging from the 0- to L-dimension which have known error location numbers as their roots and are defined by $$\sigma_j(Z) = \prod_{i=0}^{j} (Z - X_i)$$
$$= \sigma_{j,j} \times Z^j + \sigma_{j-1,j} \times Z^{j-1} + \ldots + \sigma_{i,j} \times Z^i + \ldots + \sigma_{0,j}$$

(where $0 \leq j \leq L$ and $0 \leq i \leq j$);

a second compute means for computing a modified $T_k$ for k ranging from 0 to $d-2-L$ by use of the L-dimension error location polynomial expansion coefficients $\sigma_{i,L}$ out of the results obtained from said first compute means and the syndrome ranging from $S_0$ to $S_{d-2}$ computed by said syndrome generating circuit, according to an expression $$T_k = \sum_{i=0}^{L} \sigma_{i,L} \times S_{k+1};$$

a third compute means, using said modified syndrome $T_k$ in place of syndromes ranging from $S_0$ to $S_{d-2}$ in a correcting code decoding procedure free of erasure correction, for determining location polynomial coefficients and error evaluating expression coefficients through operating syndromes ranging from $S_0$ to $S_{d-2}$ and, complying with said error correcting code decoding procedures free of erasure correction, for determining the expansion coefficients or $\sigma_{i,L+t-1}$ for the t-dimension error location polynomial relative to the error location numbers ranging from $X_L$ to $X_{L+t-1}$ for t errors other than said known error location numbers, to be defined by $$\sigma_j(Z) = \prod_{i=L}^{L+t-i} (Z - X_i)$$
$$= \sigma_{L+t-1,L+t-1} \times Z^t + \sigma_{L+t-2,L+t-1} \times Z^{t-1} + \ldots + \sigma_{L+1,L+t-1} \times Z + \sigma_{L,L+t-1},$$

and for determining the expansion coefficients of $\eta_{i,t}$ for the error evaluating polynomial for the intermediate error values to be obtained, to be defined by $$\eta_t(Z) = \sum_{i=L}^{L+t-1} Y_{i,L} \times X_i \times \prod_{j=L, j=i}^{L+t+1} (Z - X_j);$$

a fourth compute means for determining the error location numbers ranging from $X_L$ to $X_{L+t-1}$ which are the roots of the t dimension error location polynomial relevant to the errors other than said known error locations obtained by said third compute means;

a fifth compute means for determining error quantity intermediate values ranging from $Y_{L,L}$ to $Y_{L+t-1,L}$ to be obtained by substituting the t error location numbers obtained by said fourth compute means into an expression $$Y_{i,L} = \eta_t(X_i)/(X_i \sigma_t(X_i))$$

wherein the error evaluating polynomial is divided by the error location polynomial obtained by said third compute means as differentiated in form; and a sixth compute means for consecutive computation for determining the ultimate error quantities ranging from $Y_{L+t-1,0}$ to $Y_{0,0}$ regarding all the $L+$ error location numbers, for computing $Y_{j,j}$ by use of an expression $$Y_{i,j} = \sum_{i=j+1}^{L+t-1} Y_{i,j+1}/(X_i + X_j) + \sum_{i=0}^{j} \sigma_{i,j} \times S_i$$

wherein j is allowed to change from $L-1$ to 0 under the condition $i \leq j$, and for consecutively obtaining the results in a next computing step for the determination of $Y_{j-1,j-1}$ with j decreased by one wherein the intermediate results of the respective computations with a right-hand side put to $Y_{i,j+1}/X_i+X_j)=Y_{i,j}$ and the results of the computation of the above left-hand side $Y_{j,j}$ are used consecutively for substitution;

and said apparatus performing a correction by adding thus obtained error quantities ranging from $Y_{L+t-1,0}$ to $Y_{0,0}$ to location symbols indicated by said received code word error location numbers ranging from $X_{L+t-1}$ to $X_0$.

2. An error code correction apparatus provided with a Galois field arithmetic unit for correcting errors produced in code words by use of inputted error correcting codes, constituted of elements of a Galois field $GF(2^r)$ wherein r-bit binary data constitute a symbol having a minimum distance d and including post-reception errors, and location numbers ranging from $X_0$ to $X_{L-1}$ whose error locations are partially known out of all the locations of errors produced in said received error correcting codes, comprising:

a syndrome generating circuit for generating $d-1$ syndromes ranging from $S_0$ to $S_{d-2}$ by product-summing code word information symbol locations with coefficients predetermined in response to the code word information symbol locations;

a first compute means for attaining the expansion coefficients $\sigma_{i,j}$ for error location polynomials ranging from the 0- to L-dimension which have known error location numbers as their roots and are defined by $$\sigma_j(Z) = \prod_{i=0}^{j} (Z - X_i)$$

$$= \sigma_{j,j} \times Z^j + \sigma_{j-1,j} \times Z^{j-1} + \ldots + \sigma_{i,j} \times Z^i + \ldots + \sigma_{0,j}$$

(where $0 \leq j \leq L$ and $0 \leq i \leq j$);

a second compute means for determining an intermediate result $P_j$ by operating the expansion coefficients $\sigma_{i,j}$ obtained from said first compute means and said syndrome $S_i$ using an expression $$P_j = \sum_{i=0}^{j} \sigma_{i,j} \times S_1$$

and for determining the modified syndrome $T_k$ for $k=0$ using $P_j = P_L = T_0$ where $j=L$;

a third compute means for computing a modified $T_k$ for k ranging from 0 to $d-2-L$ by use of the L-dimension error location polynomial expansion coefficients $\sigma_{i,L}$ out of the results obtained from said first compute means and the syndrome ranging from $S_0$ to $S_{d-2}$ computed by said syndrome generating circuit, according to an expression $$T_k = \sum_{i=0}^{L} \sigma_{i,L} \times S_{k+1};$$

a fourth compute means, using said modified syndrome $T_k$ in place of syndromes ranging from $S_0$ to $S_{d-2}$ in a correcting code error decoding procedure free of erasure correction, for determining error location polynomial coefficients and error evaluating expression coefficients through operating syndromes ranging from $S_0$ to $S_{d-2}$ and, complying with said error correcting code decoding procedure free of erasure correction, for determining the expansion coefficients or $\sigma_{i,L+t-1}$ for the t-dimension error location polynomial relative to the error location numbers ranging from $X_L$ to $X_{L+t-1}$ for t errors other than said known error location numbers, to be defined by $$\sigma_j(Z) = \prod_{i=L}^{L+t-i} (Z - X_i)$$

$$= \sigma_{L+t-1,L+t-1} \times Z^t +$$
$$\sigma_{L+t-2,L+t-1} \times Z^{t-1} + \ldots +$$
$$\sigma_{L+1,L+t-1} \times Z + \sigma_{L,L+t-1},$$

and for determining the expansion coefficients or $\eta_{i,t}$ for the error evaluating polynomial for the intermediate error values to be obtained, to be defined by $$\eta_t(Z) = \sum_{i=L}^{L+t-1} Y_{i,L} \times X_i \times \prod_{j=L, j=i}^{L+t+1} (Z - X_j);$$

a fifth compute means for determining the error location numbers ranging from $X_L$ to $X_{L+t-1}$ which are the roots of the t dimension error location polynomial relevant to the errors other than said known error locations obtained by said fourth compute means;

a sixth compute means for determining error quantity intermediate values ranging from $Y_{L,L}$ to $Y_{L+t-1,L}$ to be obtained by substituting the t error location numbers obtained by said fifth compute means into an expression $$Y_{i,L} = \eta_t(X_i)/(X_i \sigma_t(X_i))$$

wherein the error evaluating polynomial is divided by the error location polynomial obtained by said fourth compute means as differentiated in form; and a seventh compute means for consecutive computation for determining the ultimate error quantities ranging from $Y_{L+t-1,0}$ to $Y_{0,0}$ regarding all the $L+t$ error location numbers, for computing $Y_{j,j}$ by use of an expression $$Y_{j,j} = \sum_{i=J+1}^{L+t-1} Y_{i,j+1}/(X_i + X_j) + P_j$$

wherein j is allowed to change from L−1 to 0 under the condition i≦j, and for consecutively obtaining the results in a next computing step for the determination of $Y_{j-1,j-1}$ with j decreased by one wherein the intermediate results of the respective computations with a right-hand side put to $Y_{i,j+1}/X_i+X_j)=Y_{i,j}$ and the results of the computation of the above left-hand side $Y_{j,j}$ are used consecutively for substitutions;

and said apparatus performing a correction by adding thus obtained error quantities ranging from $Y_{L+t-1,0}$ to $Y_{0,0}$ to location symbols indicated by said received code word error location numbers ranging from $X_{L+t-1}$ to $X_0$.

* * * * *